US006332661B1

(12) United States Patent
Yamaguchi

(10) Patent No.: US 6,332,661 B1
(45) Date of Patent: Dec. 25, 2001

(54) CONSTANT CURRENT DRIVING APPARATUS AND CONSTANT CURRENT DRIVING SEMICONDUCTOR INTEGRATED CIRCUIT

(75) Inventor: Hiroshi Yamaguchi, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/535,962

(22) Filed: Mar. 27, 2000

(30) Foreign Application Priority Data

Apr. 9, 1999 (JP) ................................................ 11-102917

(51) Int. Cl.[7] ................................ H03B 1/00; H03K 3/00

(52) U.S. Cl. .......................... 317/108; 327/538; 327/543; 326/82; 326/83; 345/100

(58) Field of Search .................................... 327/538, 540, 327/543, 108; 323/312, 315; 345/36, 39, 52, 100, 98; 326/83, 82

(56) References Cited

U.S. PATENT DOCUMENTS 4,701,636 * 10/1987 Millhollan et al. .................. 327/540
5,023,476 * 6/1991 Watanable et al. .................. 327/540
5,124,580 * 6/1992 Matthews et al. ................... 327/538
5,302,892 * 4/1994 Tada et al. .......................... 324/73.1
5,739,805 * 4/1998 Dingwall .............................. 345/100
5,767,698 * 6/1998 Emeigh et al. ........................ 326/83
6,031,515 * 2/2000 Okamoto ............................. 345/100
6,100,749 * 8/2000 Itoh ..................................... 323/312
6,157,180 * 12/2000 Kuo ..................................... 323/315

FOREIGN PATENT DOCUMENTS

A8-169139 7/1996 (JP) .

* cited by examiner

*Primary Examiner*—Terry D. Cunningham
*Assistant Examiner*—Long Nguyen

(57) ABSTRACT

An object of the present invention is to drive a lot of loads by using a plurality of constant current driver ICs in a state of small variations in output currents among the constant current driver ICs. In order to drive a plurality of organic EL devices of an EL display panel 50 at constant currents, two or more constant current driver ICs are used. In the individual constant current driver ICs, a constant current driver circuit and a control circuit are embedded. In the first constant current driver IC, a reference current generating circuit is further embedded to derive a reference output current generated on a reference resistance from a reference output terminal. A reference output current from the reference current generating circuit is inputted to a reference current input terminal of each constant current driver IC to output the same current value of driving currents from a plurality of driving output terminals each. The driving currents are on-off-controlled by the control circuits.

12 Claims, 4 Drawing Sheets

12

CONSTANT CURRENT DRIVING APPARATUS AND CONSTANT CURRENT DRIVING SEMICONDUCTOR INTEGRATED CIRCUIT

BACKGROUND OF THE INVENTION

1. Field of the Invention

The present invention relates to a constant current driving apparatus which drives each of a lot of loads at a constant current, and a constant current driving semiconductor integrated circuit for use in such a constant current driving apparatus.

2. Description of the Related Art

Traditionally, in a light-emitting diode (abbreviated as "LED" hereinafter) printer head, an LED display panel which are formed by arranging a lot of LED devices, an organic electroluminescence (abbreviated as "EL" hereafter) display panel which utilizes an EL phenomenon of a specific organic compound, and the like, a lot of loads such as light-emitting devices are individually driven at a constant current. Since all these loads need to be driven at a time, they are often driven by using a plurality of constant current driver integrated circuits (occasionally abbreviated as "IC" hereinafter), which are semiconductor ICs provided with a plurality of constant current output terminals. In this case, when variations arise in output current values of the constant current driver ICs, variations arise in light-emitting amounts or the like of the light-emitting devices, print inconsistencies are caused in a printer, and display inconsistencies are caused in a display panel. In order to reduce such inconsistencies, it is required to minimize variations in output currents of the constant current driver ICs among the constant current output terminals.

On the other hand, in ICs produced from the same mask in the same process step and formed on different semiconductor chips, devices such as transistors and resistances formed on the semiconductor chips have different electrical characteristics, respectively, so that the ICs are not highly matched. However, among devices such as transistors and resistances formed on the same semiconductor chip, a relative error of electrical characteristics is small, so that the ICs are highly matched. For this reason, although variations in output currents of the driver ICs are small among constant current output terminals of the same IC, the variations are relatively large among different ICs. Therefore, in the case of using a plurality of driver ICs to drive light-emitting devices of an LED printer head, an LED display panel, an organic EL display panel and the like, it is required to correct variations among the driver ICs.

Variations among driver ICs are corrected by externally mounting a current setting resistance on each driver IC and regulating resistance values of the current setting resistances. Japanese Unexamined Patent Publication JP-A 8-169139 (1996) discloses a prior art of embedding a current setting resistance which is capable of changing a combined resistance value by combination in each driver IC used for driving an LED head, changing a combined resistance value of a combination of resistances so as to correspond to correction data from outside, and changing a constant current value.

In the conventional method of regulating a current setting resistance value and correcting variations among driver ICs used for driving at a constant current, there is a problem that it is hard to automate an assembly operation of assembling display devices and driver ICs in an LED printer head, an LED display panel, an organic EL display panel or the like. Although variations in constant current outputs are decreased by forming driver ICs into a single semiconductor integrated circuit, the size of the semiconductor integrated circuit is large and the area necessary for a semiconductor chip is also large. In addition, general versatility as a driver IC is lost, with the result that the driver IC becomes exclusive to a specific LED head, LED display panel, organic EL display panel or the like. Such a problem is also true in a driver IC which outputs a constant voltage.

SUMMARY OF THE INVENTION

An object of the invention is to provide a constant current driving apparatus and a constant current driving semiconductor integrated circuit, which can reduce inconsistencies of current in outputs among the plural parts of semiconductor circuits even in the case of driving a plurality of loads by a plurality of semiconductor circuits.

The invention provides a constant current driving apparatus which drives a plurality of loads at a same current, the constant current driving apparatus comprising:

a plurality of constant current driving semiconductor integrated circuits, number of which is less than total number of the loads; and a reference signal producing circuit for producing a reference signal, each of the constant current driving semiconductor integrated circuits being formed of circuit elements integrated on a single semiconductor chip, and comprising:

a plurality of drive circuits having one or more reference input terminals, and two or more output terminals for driving two or more but part of the loads at a constant current corresponding to the reference signal inputted to the reference input terminal, and a control circuit having driving input terminals for the loads for on-off-controlling outputs of the individual output terminals of the drive circuits in accordance with input signals to the driving input terminals, the reference signal producing circuit being formed of circuit elements integrated on a single semiconductor chip, for supplying same reference signals, to the reference input terminals of the driver circuits in the plurality of constant current driving semiconductor integrated circuits.

According to the invention, a plurality of loads are driven individually at the same current by a plurality of drive circuits included in a plurality of constant current driving semiconductor integrated circuits. Each constant current driving semiconductor integrated circuit includes a drive circuit and a control circuit. The drive circuit has one or more reference input terminals and two or more output terminals and drives some of the loads individually at a constant current which is outputted to the respective output terminals, corresponding to reference signals inputted to the reference input terminals. The control circuit has driving input terminals for the individual loads and carries on-off control of outputs of the output terminals of the drive circuits individually in accordance with input signals to the driving input terminals. To the reference input terminal of the drive circuit, a reference signal from a reference signal producing circuit is supplied. The reference signal producing circuit is integrated on the same semiconductor chip as the constant current driving semiconductor integrated circuits, and produces a reference signal so as to supply the same reference signal to the reference input terminals of the constant current driving semiconductor integrated circuits. From the reference signal producing circuit, reference signals with small variations are produced and supplied to the individual reference input terminals of the drive circuit in the constant current driving semiconductor integrated circuits. Constant currents for driving the loads in correspondence with the reference signals in the individual constant current driving semiconductor integrated circuits are outputted from the drive circuits on the single semiconductor chip, so that variations can be minimized. Driving currents from different constant current driving semiconductor integrated circuits are also outputted in correspondence with reference signals with small variations produced from the reference signal producing circuit on the single semiconductor chip, so that variations in output currents can be minimized without regulation by a resistance or the like.

As described above, according to the invention, it is possible to drive a plurality of loads at constant currents with small variations supplied from a plurality of constant current driving semiconductor integrated circuits, and on-off-control driving outputs. Since regulation among the constant current driving semiconductor integrated circuits is not necessary in order to minimize variations in outputs, it is possible to eliminate the inconvenience of regulation required in assembly of a constant current driving apparatus, and automate an assembly operation with ease.

Further, in the invention it is preferable that the reference signal producing circuit is integrated on the same semiconductor chip as that of at least one of the constant current driving semiconductor integrated circuits.

According to the invention, the reference signal producing circuit is integrated on the same semiconductor chip as at least one of the constant current driving semiconductor integrated circuits, so that it is not necessary to mount the reference signal producing circuit apart from the constant current driving semiconductor integrated circuits, and it is possible to downsize a circuit used for assembling a display panel or the like together with the loads.

As described above, according to the invention, at least one of the constant current driving semiconductor integrated circuits is integrated on the same semiconductor chip as the reference signal producing circuit, so that it is possible to downsize the constant current driving circuit and simplify assembly.

Still further, in the invention it is preferable that the reference signal producing circuit supplies a same value of current to the respective constant current driving semiconductor integrated circuits as the reference signal.

According to the invention, the constant current driving semiconductor integrated circuits drive the loads individually at the same value of current in correspondence with the same value reference current input from the reference signal producing circuit, so that it is possible to drive a lot of loads at a constant current with small variations in value.

As described above, according to the invention, the constant current driving semiconductor integrated circuits drive the individual loads at the same value of current in correspondence with a reference signal, so that it is possible to drive the loads at a constant current with ease.

Still further, the invention provides a constant current driving semiconductor integrated circuit, integrated on a single semiconductor chip, for driving a plurality of loads at output currents which are constant and of a same value, the constant current driving semiconductor integrated circuit comprising:

a plurality of constant current driving circuits, each having one or more reference current input terminals and a plurality of driving output terminals, for deriving outputs for driving the individual loads at the same value of constant current from the individual driving output terminals in accordance with a reference current inputted to the reference current input terminals; and a reference current producing circuit, having a plurality of reference current output terminals, for producing same value output currents from the individual reference current output terminals.

According to the invention, the constant current driving semiconductor integrated circuit is formed on a single semiconductor chip, and includes driving circuits and a reference current producing circuit. Each of the driving circuits has one or more reference current input terminals and a plurality of driving output terminals, and derives outputs for driving the individual loads at the same value of constant currents from the individual driving output terminals in accordance with reference currents inputted to the reference current input terminals. The driving circuits are formed on the same semiconductor chip, so that it is possible to minimize variations in values of constant currents for driving the individual loads. The reference current producing circuit is also formed on the same semiconductor chip, so that it is possible to derive outputs with small variations among the reference current output terminals from the individual terminals. By designing so as to supply one of constant output currents with small variations in values to a driving circuit formed on the same semiconductor chip and supply the rest of the outputs to driving circuits formed on another semiconductor chip, it is possible to drive a plurality of loads each at constant currents with small variations in values by driving circuits formed on another semiconductor chip.

As described above, according to the invention, in a constant current driving semiconductor integrated circuit, by designing so as to derive reference current outputs with small variations from a plurality of reference current output terminals and input one of the outputs to reference current input terminals, it is possible to derive constant current outputs with small variations from a plurality of driving output terminals. By connecting the rest of the reference current output terminals to reference input terminals of a constant current driving circuit of another constant current driving semiconductor integrated circuit, it is possible to drive a plurality of loads at constant current outputs with small variations also by another constant current driving semiconductor integrated circuit.

Still further, in the invention it is preferable that the constant current driving semiconductor integrated circuit further comprises a shift register circuit, having a serial input terminal to which signals for carrying out on-off control of outputs of the constant current driving circuits are inputted serially, for outputting in parallel the signals inputted to the serial input terminal; and a latch circuit, having a latching input terminal, for latching the parallel outputs of the shift register circuit in accordance with the signals inputted to the latching input terminal, to carry out on-off control of outputs of the constant current driving circuits by the latched outputs.

According to the invention, the driving circuits for supplying constant current outputs to the individual loads are on-off-controlled at outputs obtained by outputting signals inputted to a shift register circuit serially from the shift register circuit in parallel and latching by a latch circuit. By using a serial input terminal of the shift register circuit and a latching input terminal of the latch circuit, it is possible to on-off-control constant current outputs from a lot of driving output terminals.

As described above, according to the invention, it is possible to on-off-control constant current outputs for driving a plurality of loads in accordance with signals inputted serially. Since the signals for control are inputted serially, it is possible to on-off-control constant current outputs for driving a lot of loads, without increasing the number of input terminals.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
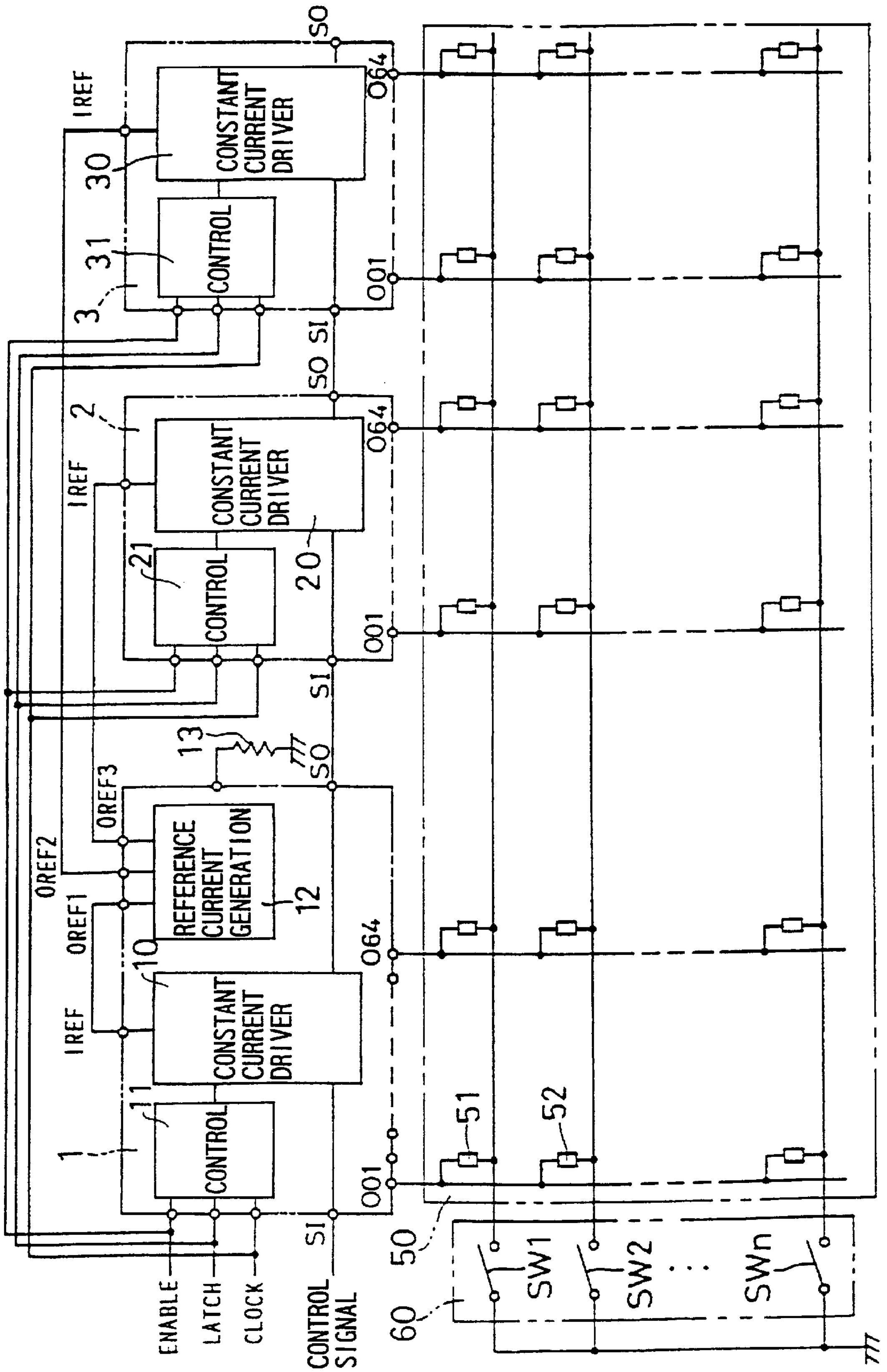
FIG. 1 is a schematic block diagram showing an electrical configuration of an organic EL display panel which serves as a constant current driving apparatus of an embodiment of the invention.

Now referring to the drawings, preferred embodiments of the invention are described below.

FIG. 1 schematically shows an electrical configuration of an organic EL display panel as a constant current driving apparatus of an embodiment of the invention. Each of three constant current driver ICs 1, 2, 3 is capable of deriving the same value of driving outputs from 64 driving output terminals 001–064 in correspondence with a reference current inputted to a single reference current input terminal IREF. The first constant current driver IC 1 includes: a constant current driver circuit 10 which supplies a driving current to each of the 64 driving output terminals 001–064 in accordance with the reference current inputted to the reference current input terminal IREF; a control circuit 11 for on-off-controlling the driving current outputted from the constant current driver circuit 10 in correspondence with an input signal; and a reference current generating circuit 12 which generates the same value of reference currents from three reference current output terminals OREF 1–3 including a reference current output terminal for supplying a reference current to the reference current input terminal of the constant current driver circuit 10. The reference current generating circuit 12 is capable of regulating the value of the reference currents derived from the reference current output terminals OREF 1–3, by a reference resistance 13 which is externally mounted to the constant current driver IC 1. The constant current driver ICs 2, 3 also includes constant current driver circuits 20, 30 and control circuits 21, 31, respectively.

In an EL display panel 50, 192 rows of organic EL devices composed by placing organic EL devices 51, 52, . . . in a 192-X n-dot matrix are divided into three parts of 64 rows, and the 64 rows are driven individually as loads by the driving output terminals 001–064 of each of the constant current driver circuit ICs 1, 2, 3. An $n^{th}$ line, which is an arbitrary line, of the EL panel 50 is selected by causing only one of switching devices SW1, SW2, . . . , SWn included in a line selecting circuit 60 to conduct. Organic EL devices placed on points of intersection of a line selected by the line selecting circuit 60 and the individual rows are selected and driven by the constant current driver circuits 10, 20, 30.

The organic EL devices 51, 52, . . . of the EL display panel 50 are on-off-controlled individually on the basis of serial signals inputted to serial input terminals SI of the constant current driver ICs 1, 2, 3. And an image is displayed on the EL display panel 50 in correspondence with on or off conditions of the organic EL devices 51, 52, . . . Since the same value of currents are supplied from the constant current driver ICs 1, 2, 3 to organic EL devices 51, 52, . . . in the on state, it is possible to display an image in a state of small variations in brightness among pixels in the on state.

A serial signal inputted to the serial input terminal SI is supplied in synchronization with a clock signal inputted to a clock terminal CLOCK, and outputted from a serial output terminal SO. The serial input terminal SI of the second constant current driver IC 2 is connected to the serial output terminal SO of the first constant current driver IC 1, and the serial input terminal SI of the third constant current driver IC 3 is connected to a serial output terminal SO of the second constant current driver IC 2. By inputting display data for 192 rows in synchronization with a clock signal to the serial input terminal SI of the first constant current driver IC 1, it is possible to supply display data of the individual rows to shift register circuits for 64 stages included in the control circuits 11, 21, 31 of the constant current driver ICs. Display data of each row is captured from the shift register into a latch circuit in accordance with a latch signal inputted to a latch inputting terminal LATCH, whereby driving outputs from the individual constant current driver circuits 10, 20, 30 to the driving output terminals 001–064 are on-off-controlled in accordance with a signal supplied to an enable input terminal ENABLE. A clock input signal CLOCK, a latching input signal LATCH, and an enabling input signal ENABLE are supplied, respectively, to the individual constant current driver ICs 1, 2, 3 in common.

Figure 2:
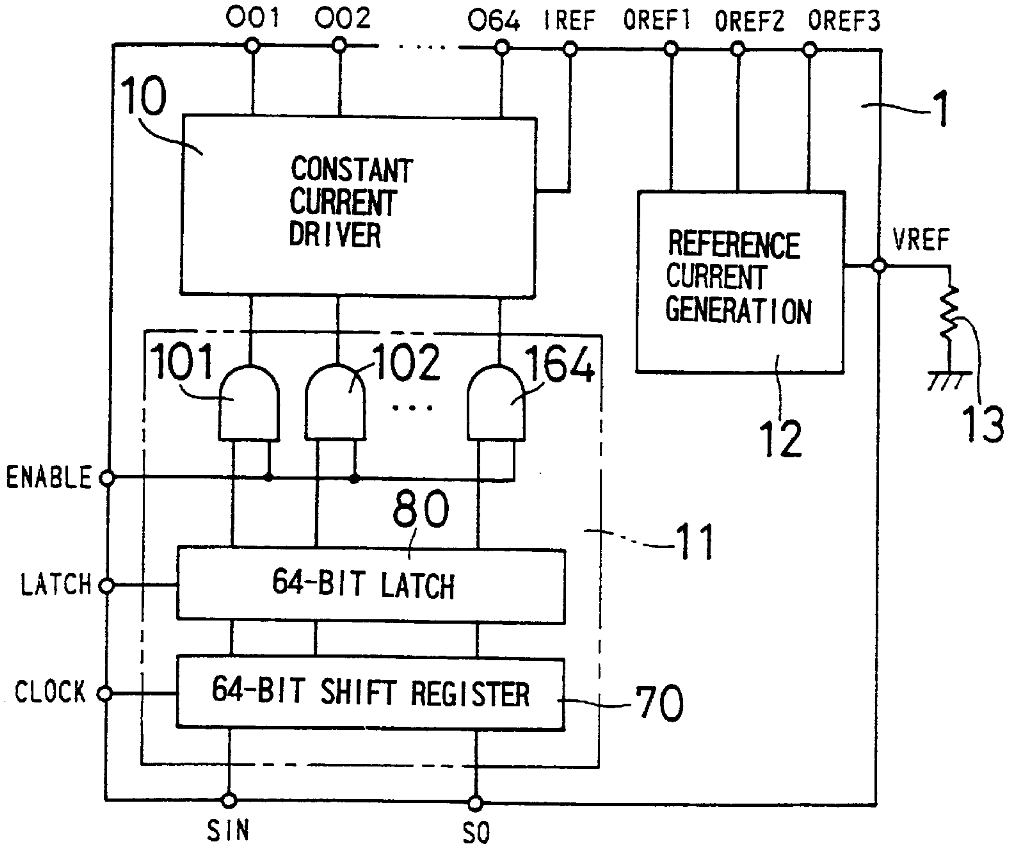
FIG. 2 is a schematic block diagram showing an electrical configuration of a constant current driver IC 1 which is used in the embodiment shown by FIG. 1.

FIG. 2 schematically shows an electrical configuration of the constant current driver IC 1 shown by FIG. 1. The control circuit 11 includes a 64-bit shift register 70 and a 64-bit latch 80. The 64-bit shift register 70 causes registers for 64 bits to store serial signals inputted to the serial input terminal SI in synchronization with a clock signal CLOCK inputted to the clock terminal. The 64-bit latch 80 serving as a latch circuit captures and holds output data from the 64-bit shift register 70 in response to a latching signal LATCH supplied from outside. The output data in the 64-bit latch 80 are derived at all times, and control the 64-bit constant current driver circuit 10 via 64 AND gates 101, 102, . . . , 164. A reference current is inputted to the constant current driver circuit 10, and the same value of output current is derived for a current mirror circuit. It is also possible to place a plurality of reference current input terminals IREF and thereby derive the same value of output current as the sum of the values of inputted currents.

Figure 3:
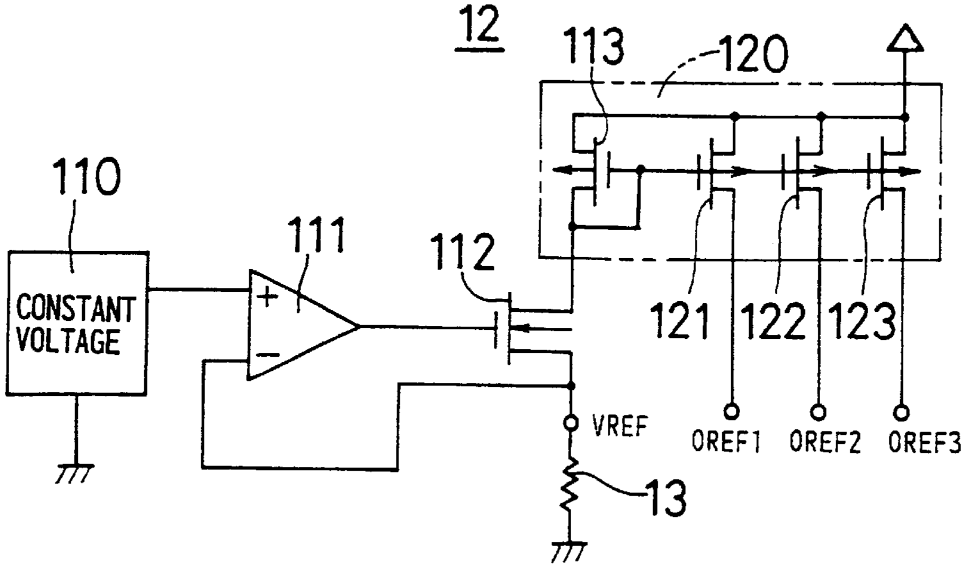
FIG. 3 is a schematic block diagram showing an electrical configuration of a reference current generating circuit 12 which is used in the constant current driver IC 1 shown by FIG. 2.

FIG. 3 schematically shows an electrical configuration of the reference current generating circuit 12 shown in FIG. 2. A constant voltage circuit 110 outputs a constant voltage. An operational amplifier 111 such as a CMOS operational amplifier supplies a signal voltage to a gate of a controlling NMOS transistor 112 so that voltages generated in the reference resistance 13 are equal referring to an output voltage from the constant voltage circuit 110. The reference resistance 13 is connected to a source side of the controlling NMOS transistor 112 via a reference voltage input terminal VREF. To a drain side of the controlling NMOS transistor 112, a drain of a controlling PMOS transistor 113 is connected. The controlling NMOS transistor 112 passes a constant current, based on an output voltage from the constant voltage circuit 110 and the externally mounted reference resistance 13 shown in FIGS. 1 and 2.

The controlling PMOS transistor 113 is included in a current mirror circuit 120 and capable of deriving the same current value of reference currents from three outputting PMOS transistors 121, 122, 123 individually which are included in the current mirror circuit 120. Sources of the outputting PMOS transistors 121, 122, 123 as well as a source of the controlling PMOS transistor 113 are connected in common and provided with a positive power voltage Vcc. A gate of the controlling PMOS transistor 113 and gates of all the outputting PMOS transistors 121, 122, 123 are connected in common, and connected to a common node between the drain of the controlling PMOS transistor 113 and the drain of the controlling NMOS transistor 112.

Through the current mirror circuit 120, source-drain currents of the outputting PMOS transistors 121, 122, 123 pass in correspondence with a source-drain current passing through the controlling PMOS transistor 113. Since all the outputting PMOS transistors 121, 122, 123 are formed on the same semiconductor chip and produced by an exposure process using the same shape of mask and the same processing, the outputting PMOS transistors can be produced so as to have the same characteristics, and are capable of generating reference currents derived from the reference current output terminals OREF 1–3 at currents with small variations in value. It is possible to make a reference current value correspond to a value obtained by dividing a constant voltage generated from the constant voltage circuit 110 by a resistance value of the reference resistance 13. By forming the controlling PMOS transistor 113 into the same shape with the outputting PMOS transistors 121, 122, 123, it is possible to derive the same value of currents with currents passing through the reference resistance 13 individually from the reference current output terminals OREF 1–3.

Figure 4:
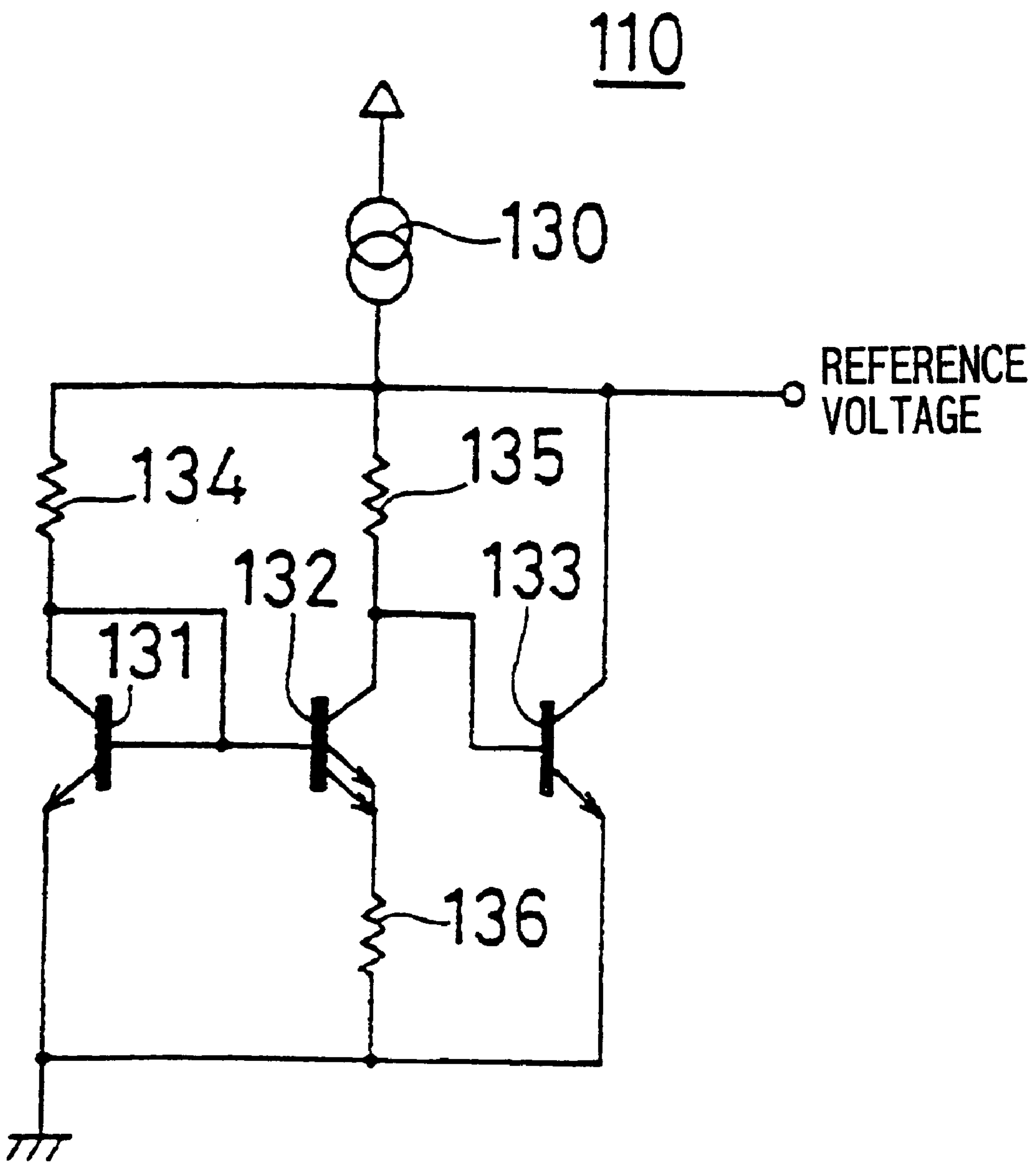
FIG. 4 is an equivalent electric circuit diagram in which a constant voltage circuit 110 shown in FIG. 3 is formed into an NPN bandgap type.

FIG. 4 shows an example of forming the constant voltage circuit 110 shown in FIG. 3 into an NPN bandgap type. By supplying a constant current from a power source via a constant current source 130 to a bandgap circuit composed of three NPN transistors 131, 132, 133 and three resistances 134, 135, 136, it is possible to take out a constant voltage based on bandgap which is basic as a semiconductor device. The first NPN transistor 131 generates a PN junction forward voltage as a PN junction diode, whereby a reference voltage with small temperature change can be obtained together with a bandgap voltage from the second NPN transistor 132.

Figure 5A:
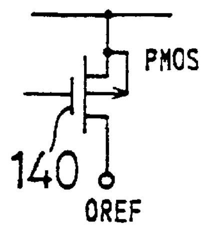
FIGS. 5A–5D are partial electric circuit diagrams showing examples of an output of a constant current driver circuit 10 shown in FIG. 2.
Figure 5B:
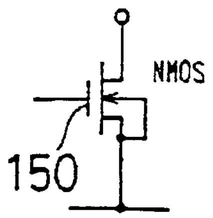
Figure 5C:
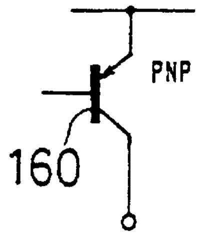
Figure 5D:
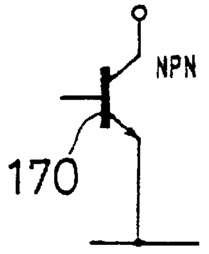

FIGS. 5A–5D show examples of an output device which is connected to each of the driving output terminals 001–064 in the constant current driver circuit 10 shown in FIG. 2. FIG. 5A shows an example of taking an output out of a PMOS transistor 140. FIG. 5B shows an example of taking an output out of an NMOS transistor 150. FIG. 5C shows an example of taking an output out of a PNP bipolar transistor 160. FIG. 5D shows an example of taking an output out of an NPN bipolar transistor 170. output devices connected to all the driving output devices are connected in parallel so as to form a current mirror circuit, so that it is possible to obtain the same current value of outputs with ease.

Although the 192 rows of organic EL devices 51, 52, . . . of the EL display panel 50 are divided by 64 rows and driven by the three constant current driver ICs 1, 2, 3 in the embodiment shown by FIG. 1, the number of the rows, the number of the constant current driver ICs used therein, the number of outputs which can be driven by each constant current driver IC, and the like may be changed. Further, loads driven at constant currents are not limited to the organic EL devices 51, 52, . . . of the EL display panel 50, and LED devices of an LED display panel, an LED printer head and the like may be driven at constant currents as well without regulation by a resistance or the like.

Although the reference current generating circuit 12 is embedded in the constant current driver IC 1 in the embodiment shown by FIG. 1, the reference current generating circuit 12 may be formed as a separate semiconductor integrated circuit. By forming the reference current generating circuit as a freestanding semiconductor integrated circuit, it is possible to increase the number of the reference current output terminals, and derive, from a lot of constant current driver ICs, constant current driving outputs with small variations in output currents among the ICs.

Further, the constant current driver ICs 1, 2, 3 may be configured in the same manner by embedding the reference current generating circuits 12 also in the constant current driver ICs 2, 3. In this case, the reference current output terminals OREF of the reference current generating circuits 12 in the constant current driver ICs 2, 3 are not used, and a reference current output terminal OREF of the constant current driver IC 1 is connected to the reference current input terminal IREF. That is to say, in the constant current driver ICs 2, 3, the reference current generating circuits 12 are embedded, but not used. As a result, it is possible to standardize the constant current driver ICs 1, 2, 3 and produce the ICs in volume with ease.

Furthermore, loads may be driven at constant currents by supplying a signal of a reference voltage or a reference period, instead of a reference current.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A constant current driving apparatus which drives a plurality of loads at a same current, comprising:

- a plurality of constant current driving semiconductor integrated circuits less in number than a total number of the loads; and
- a reference signal producing circuit for producing a reference signal, each of the constant current driving semiconductor integrated circuits being formed of circuit elements integrated on a single semiconductor chip, and including
  - a drive circuit having one or more reference input terminals, and two or more output terminals for driving two or more of the loads at a constant current corresponding to the reference signal inputted to the reference input terminal, and
  - a control circuit having driving input terminals for the loads for on-off-controlling outputs of the individual output terminals of the drive circuits in accordance with input signals to the driving input terminals, the reference signal producing circuit being formed of circuit elements integrated on a single semiconductor chip, for supplying same reference signals, to the reference input terminals of the driver circuits in the plurality of constant current driving semiconductor integrated circuits.

2. The constant current driving apparatus of claim 1, wherein the reference signal producing circuit is integrated on the same semiconductor chip as that of at least one of the constant current driving semiconductor integrated circuits.

3. The constant current driving apparatus of claim 1, wherein the reference signal producing circuit supplies a same value of current to the individual constant current driving semiconductor integrated circuits as the reference signal.

4. A constant current driving semiconductor integrated circuit, integrated on a single semiconductor chip, for driving a plurality of loads at output currents which are constant and of a same value, comprising:

a constant current driving circuit having one or more reference current input terminals and a plurality of driving output terminals, for deriving outputs for driving each of the plurality of loads at the same value of constant current from the individual driving output terminals in accordance with a reference current inputted to the reference current input terminals;

a reference current producing circuit connected to the constant current driving circuit, having a plurality of reference current output terminals, for producing output currents of a same value from the individual current output terminals;

a shift register circuit, having a serial input terminal to which signals for carrying out on-off control of outputs of the constant current driving circuits are inputted serially, for outputting in parallel the signals inputted to the serial input terminal; and a latch circuit, having a latching input terminal, for latching the parallel outputs of the shift register circuit in accordance with the signals inputted to the latching input terminal, to carry out on-off control of outputs of the constant current driving circuits by the latched outputs.

5. A constant current driving apparatus for driving each of a plurality of loads with a constant drive current, comprising:

a reference current generation circuit generating a plurality of reference currents each having a reference current value; and at least two constant current driver circuits each controlled by an associated control circuit, each of said at least two constant current driver circuits driving a subset of the plurality of loads with the constant drive current in accordance with the reference current value, wherein each of the associated control circuits converts a serial control signal into a parallel signal to control the driving of each of the subset of the plurality of loads by said at least two constant current driver circuits.

6. The constant current driving apparatus of claim 5, wherein the plurality of loads are organic EL devices in an EL display panel.

7. The constant current driving apparatus of claim 5, wherein the plurality of loads are LED devices in an LED printer head.

8. The constant current driving apparatus of claim 6, wherein the plurality of loads are LED devices in an LED display panel.

9. A method of driving each of a plurality of loads with a constant drive current, comprising:

generating a plurality of reference currents each having the same value;

providing each of the plurality of reference currents to an associated constant current driver circuit;

controlling each of the associated constant current driver circuits based on an external control signal.

10. The method of claim 9, further comprising converting the control signal from a serial format into a parallel format.

11. The method of claim 9, wherein the plurality of reference currents are generated in a single integrated circuit.

12. The method of claim 11, wherein each of the associated constant current driver circuits are located on different integrated circuits.

* * * * *